United States Patent [19]

Baliga

[11] Patent Number: 4,587,712

[45] Date of Patent: May 13, 1986

[54] METHOD FOR MAKING VERTICAL CHANNEL FIELD CONTROLLED DEVICE EMPLOYING A RECESSED GATE STRUCTURE

[75] Inventor: Bantval J. Baliga, Clifton Park, N.Y.

[73] Assignee: General Electric Company, Schenectady, N.Y.

[21] Appl. No.: 692,073

[22] Filed: Jan. 17, 1985

Related U.S. Application Data

[62] Division of Ser. No. 324,299, Nov. 23, 1981, abandoned.

[51] Int. Cl.$^4$ .............................................. H01L 21/20
[52] U.S. Cl. ......................................... 29/571; 29/580; 148/175; 357/22
[58] Field of Search ....................... 29/571, 576 E, 580, 29/591; 148/DIG. 50, 175, DIG. 88; 357/22, 381, 55

[56] References Cited

U.S. PATENT DOCUMENTS

| | | | |
|---|---|---|---|
| 3,938,241 | 2/1976 | George et al. | 29/571 |
| 3,953,879 | 4/1976 | O'Connor-d'Arlach et al. | 357/22 |
| 4,343,015 | 8/1982 | Baliga et al. | 357/22 X |

Primary Examiner—Brian E. Hearn
Assistant Examiner—Alan E. Schiavelli
Attorney, Agent, or Firm—John R. Rafter; James C. Davis, Jr.; Marvin Snyder

[57] ABSTRACT

A vertical channel junction gate electric field controlled device (e.g., a field effect transistor, or a field controlled thyristor) includes a semiconductor base region layer, and a plurality of grooves having vertical walls formed in the upper surface of the base region layer. Between the grooves, generally on the upper surface of the base region layer, are upper electrode regions, for example, source electrode regions or cathode electrode regions. Recessed in the grooves are junction gate regions. Upper electrode terminal metallization is evaporated generally on the upper device layer, and gate terminal metallization is over the junction gate regions in the grooves. The disclosed structure thus has continuous metallization along the recessed gate regions for a low-resistance gate connection. The structure facilitates fabrication by methods, also disclosed, which avoid any critical photolithographic alignment steps in masking to define the location of the source (or cathode) and gate regions, and avoid the need for any mask or mask alignment for metal definition when forming electrode metallization.

21 Claims, 12 Drawing Figures

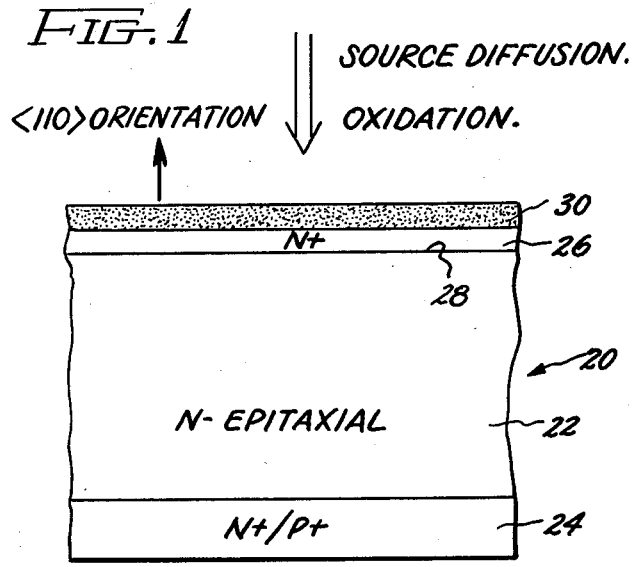
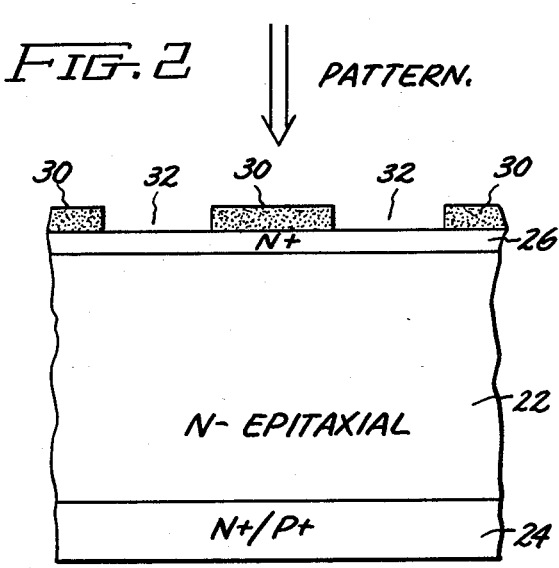
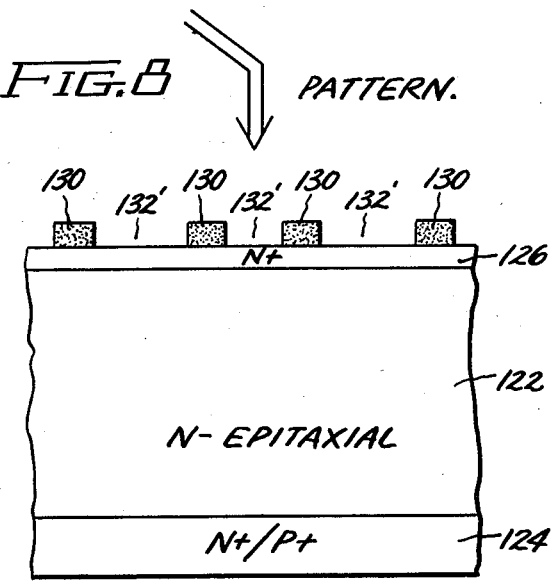
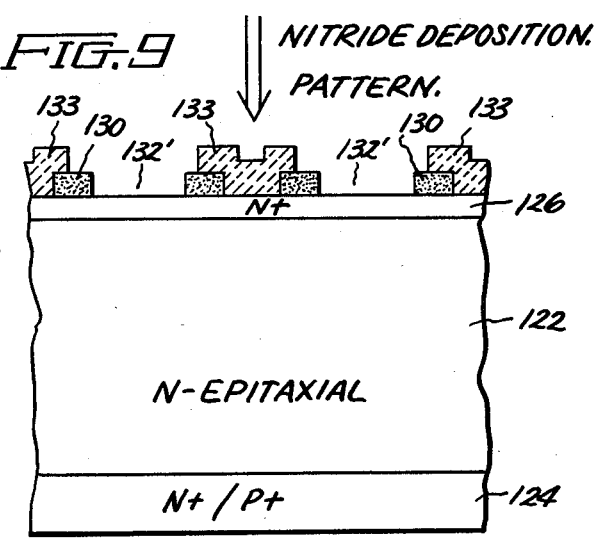

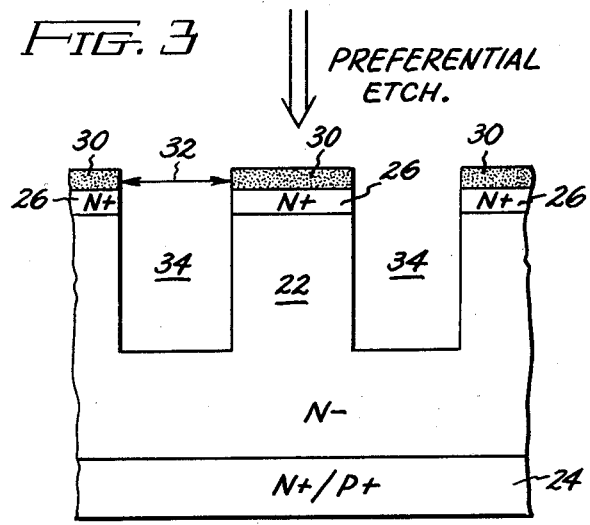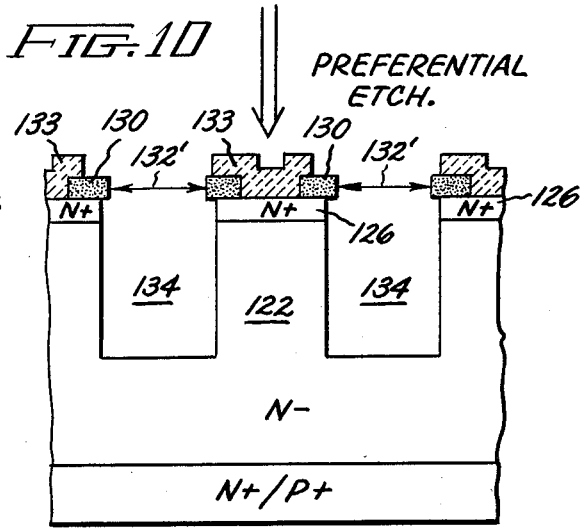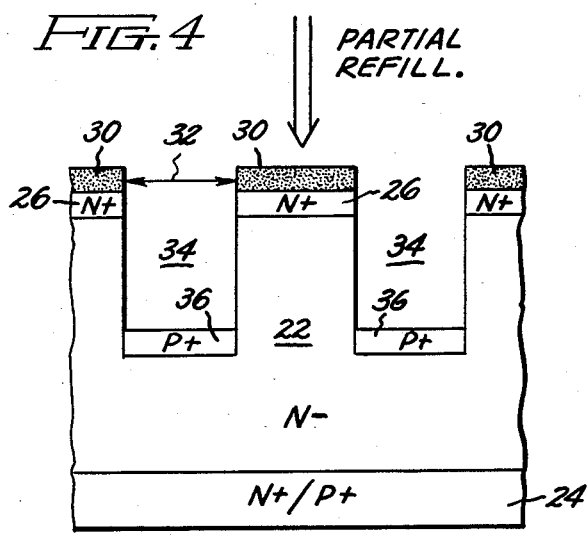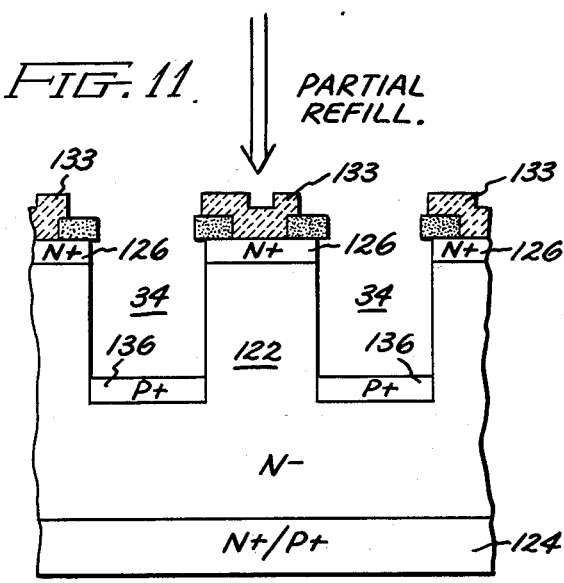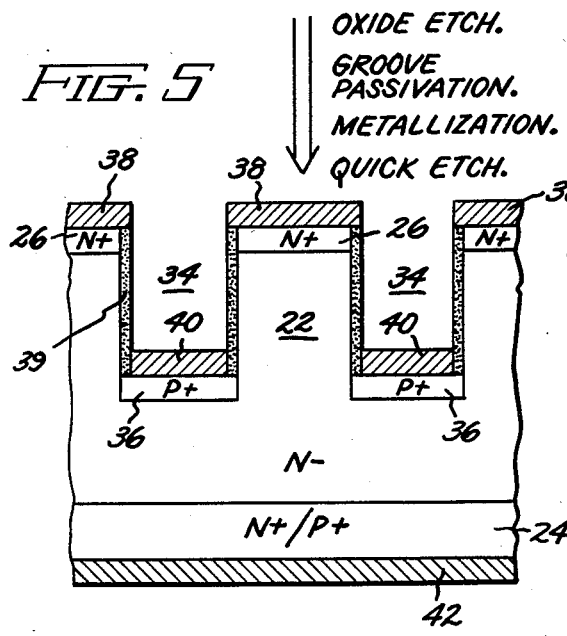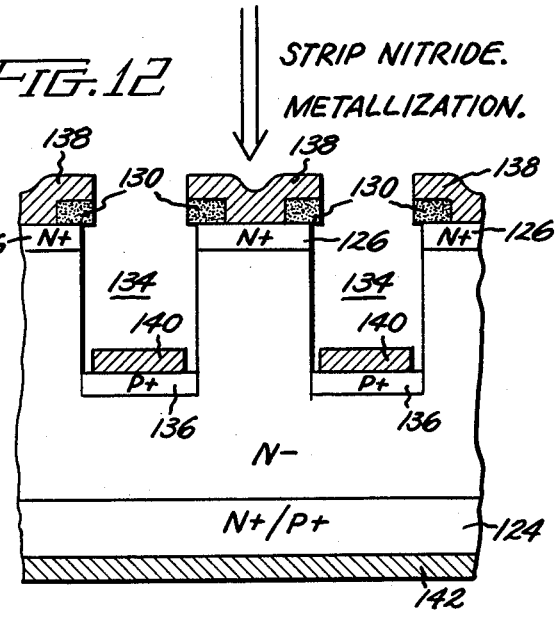

METHOD FOR MAKING VERTICAL CHANNEL FIELD CONTROLLED DEVICE EMPLOYING A RECESSED GATE STRUCTURE

This application is a division of application Ser. No. 324,299, filed 11-23-81, now abandoned.

BACKGROUND OF THE INVENTION

The present invention relates generally to vertical channel electric field controlled semiconductor devices such as field effect transistors and, more particularly, to such devices employing recessed gate structures, and methods for fabricating such devices.

Vertical-channel electric field controlled devices have recently been developed, and are suitable for power switching applications at relatively high voltages, in excess of 500 volts. These devices are of several types, including field effect transistors (FETs) and field controlled thyristors (FCTs), all having similar gate structures. For convenience, the recessed gate structure and fabrication methods of the present invention are described herein primarily with reference to vertical channel FETs. It will be appreciated, however, that the gate structures and fabrication methods are equally applicable to other forms of vertical-channel field semiconductor devices, such as FCTs.

Briefly, in a vertical-channel FET structure, source and drain regions are formed on opposite surfaces of a semiconductor wafer, the source and drain regions both, for example, being of N+ conductivity type. Intermediate the source and drain regions is an N− conductivity type base region, in turn containing a low resistivity P+ grid or gate defining a number of vertical channels. In one particular form of device, the source (or cathode) and gate regions are elongated finger-like structures, with the source (or cathode) and gate regions interdigitated. The devices are normally on, and therefore conduct with zero gate bias. As reverse gate bias is applied, a depletion region is formed which inhibits or blocks conduction vertically through the device.

Such devices are described in the literature, for example, D. E. Houston, S. Krishna, D. E. Piccone, R. J. Finke and Y. S. Sun, "A Field Terminated Diode", *IEEE Trans. Electron Devices*, Vol. ED-23, No. 8, pp. 905-511. (August 1976). In addition to this Houston et al literature reference, various forms of such devices are disclosed in the commonly-assigned patents to Ferro, U.S. Pat. No. 4,037,245, Houston et al, U.S. Pat. No. 4,060,821, Baliga, U.S. Pat. No. 4,132,996, and Hysell et al, U.S. Pat. No. 4,170,019. Additional disclosures are found in commonly-assigned Baliga and Wessels application Ser. No. 169,853, filed July 17, 1980, entitled "PLANAR GATE TURN OFF FIELD CONTROLLED THYRISTORS AND PLANAR JUNCTION GATE FIELD EFFECT TRANSISTORS, AND METHOD OF MAKING SAME", now abandoned in favor of continuation application Ser. No. 355,005, now abandoned in favor of divisional application Ser. No. 630,473. Application Ser. No. 169,853, is a continuation of now-abandoned application Ser. No. 938,020, filed Aug. 30, 1978, which is in turn a continuation-in-part of now-abandoned application Ser. No. 863,877 filed Dec. 23, 1977.

Heretofore there have been two general structures for these devices: planar or surface gate structures wherein the gate is on the surface of the device; and buried gate structures wherein the gate is buried within the base region. Buried gate devices have the advantage of increased source (or cathode) area compared to surface gate devices because, in surface gate devices, the source (or cathode) region must be located between the gate grids and sufficiently separated therefrom to obtain an acceptably high grid-source (or grid-cathode) breakdown voltage. Buried gate structures overcome this particular problem and enable a higher blocking gain to be achieved. Another advantage of buried grid devices has been the need for less critical photolithographic alignment in fabrication compared to those required for surface gate devices wherein interdigitated gate and source (or cathode) regions are fabricated to close tolerances.

One significant disadvantage to buried gate devices, however, has been that the inability to metallize a buried gate along its entire length results in higher gate resistance, which limits the frequency response of buried grid FETs and FCTs. In typical buried gate devices, remote gate contacts are required, for example, at the periphery of the wafer or device.

A hybrid approach is disclosed in the above-identified commonly-assigned Houston et al U.S. Pat. No. 4,060,821, wherein the gate is divided into surface gate portions and buried gate portions, with the buried gate portions having a greater lateral extent; at the device surface, the surface area of the cathode structure is substantially greater than that of the grid structure. This device, however, is fabricated using diffusion techniques to form the buried gate portion, with the result that the shape of the buried gate is somewhat semi-cylindrical, resulting in an undesirably small channel length-to-width ratio.

In particular, it has recently been appreciated that vertically-walled gate structures wherein the gates or grids are rectangular in cross-section provide significantly higher blocking gain. For example, the above-identified Baliga et al application Ser. No. 630,473 describes planar, junction gate FETs and FCTs having higher forward blocking capabilities and higher blocking gains than diffused-gate devices. As there described, preferential etch and refill techniques may be employed to achieve the substantially vertical walls and rectangular cross-sections. However, the epitaxial refill process is complex, and results in poor yield unless extreme care is taken during the refill to obtain a planar surface with no voids in the grooves.

By the present invention, there is provided a junction gate structure suitable for FETs and FCTs which provides a number of advantages over previous devices. Significantly, the gate fingers are metallized along their entire lengths, providing a low resistance gate connection. Moreover, the structure facilitates a manufacturing process wherein the location of the source (or cathode) and gate regions are defined by a single mask; these regions are thus in effect self-aligned, avoiding the usual photolithographic alignment problems encountered when forming interdigitated source (or cathode) and gate regions. Of additional significance, the need for a critically aligned metal definition step to defining source (or cathode) and gate metallization areas is avoided.

SUMMARY OF THE INVENTION

Accordingly, it is an object of the invention to provide a gate structure and methods for fabricating vertical channel field controlled devices such as field effect transistors and field controlled thyristors, which methods facilitate self-alignment of source (or cathode) and gate regions, and which achieve good metal contact to source (or cathode) and gate regions for low gate input resistance without the need for any critically aligned photolithographic metal definition step, and devices made thereby.

Briefly, and in accordance with an overall concept of the invention, there is provided a vertical channel junction gate electric field controlled device having a recessed gate structure. The device includes a semiconductor base region layer of one conductivity type appropriate for the base region of the ultimate device, for example N− conductivity type. There are a plurality of grooves preferably having vertical walls, formed in the upper surface of the base region layer. Between the grooves, generally on the upper surface of the base region layer, are elongated upper electrode regions, such as N+ conductivity type source regions (for an FET) or N+ conductivity type cathode regions (for an FCT). Recessed in the grooves are elongated junction gate regions of opposite conductivity type (e.g. P+ conductivity type). Finally, there are an upper electrode terminal metallization (e.g. source metallization) generally on the upper surface layer in ohmic contact with the upper electrode regions, and recessed gate terminal metallization fingers over and in ohmic contact with the elongated junction gate regions in the grooves.

In order to provide convenient contact to the recessed gate terminal metallization, a recessed gate contact pad area is adjacent to and generally at the same level as the bottoms of the grooves, and a metallized gate contact pad is formed on the pad area providing a physical and electrical extension of the gate terminal fingers.

While the depressions and gate structure are described herein as comprising grooves and elongated fingers, it will be appreciated that a variety of other geometric structures may be employed.

There are significant advantages to this structure. Fundamentally, the structure has continuous metallization along the gate fingers for a low-resistance gate connection. Thus the ultimate device is suitable for high frequency operation. Moreover, this structure facilitates fabrication by methods which avoid any critical photolithographic alignment steps in masking to define the locations of the source (or cathode) and gate regions, and which avoids the need for any mask or mask alignment for metal definition when forming electrode metallization.

More particularly, in the fabrication procces a single mask locates the openings defining the ultimate locations of both the source (or cathode) regions and the gate regions, thereby providing self-alignment between these regions, eliminating any critical photolithographic alignment step for this purpose, and permitting relatively uniform spacing throughout the device between adjacent source (or cathode) and gate regions.

Further, in the fabrication method of the invention, a single metallization step provides both the source (or cathode) metallization on the surface of the device and the recessed gate metallization without the need for any critically-aligned photolithographic metal definition step normally required in such devices. The aluminum in the recessed gate area is inherently separated from the aluminum connecting the source fingers together at the top surface of the device. A shadowing created by the overhang in the oxide at the top of the grooves aids this aspect.

In view of this structure, in accordance with another overall concept of the invention, a method of fabricating a vertical channel junction gate electric field device of the type including a semiconductor base region of one conductivity type (e.g. N− conductivity type) and a gate region of opposite conductivity type (e.g. P+ conductivity type), and having a recessed gate structure, begins with the step of providing a base layer of the one conductivity type. Next, grooves are formed in the upper surface of the base layer, elongated junction gate regions are recessed in the grooves, and elongated upper electrodes (e.g. N+ source regions) are formed generally on the upper surface of the base region layer between the grooves. This may all be achieved with a single photolithographic masking step. The precise order of these steps varies depending upon the particular method employed. Finally, metal, such as aluminum, is deposited, such as by evaporation, onto the wafer surface to form metallized electrode terminals in ohmic contact with the upper electrode (source or cathode) regions, and elongated metallized recessed gate terminal fingers in ohmic contact with the elongated junction gate regions recessed in the grooves.

Preferably, the grooves which are formed have substantially vertical sidewalls, such as may be achieved employing preferential etching techniques. In order to minimize the deposition of metal on the groove sidewalls and to provide a sharp separation between the source and gate metallizations, an oxide layer is preferably formed with a slight overhang over the edge of the grooves, prior to the step of depositing metal onto the wafer surface. This overhang provides a shadowing effect during metal evaporation.

For convenient connection to the recessed gate metallization fingers, a recessed gate contact pad area is formed adjacent to and at generally the same level as the bottoms of the grooves, preferably at the same time the grooves are formed. During metallization, metal is also deposited onto the gate contact pad area to form a gate contact pad as a physical and electrical extension of the gate terminals.

Before proceeding to the following summary of more specific structures and methods in accordance with the invention, it should be noted that herein are described specific structures generally characterized by having source regions which extend all the way to the groove sidewalls, and which are formed as part of an initial diffusion or epitaxial growth step to provide a uniform source layer over the base region. Further, the gate regions are in the groove bottoms only. This particular construction, however, critically requires that the groove sidewalls be kept clear of metallization to avoid short-circuiting the PN junctions which are formed within the grooves. An alternate structure and fabrication method comprise the subject matter of commonly-assigned application Ser. No. 324,163, filed concurrently herewith, by Baliga et al, entitled "VERTICAL CHANNEL FIELD CONTROLLED DEVICE EMPLOYING A RECESSED GATE STRUCTURE, AND METHODS OF MAKING", now abandoned in favor of divisional application Ser. No. 650,315. In this alternative structure the source regions do not extend all the way to the grooves, and the gate regions include the groove sidewalls in the alternative structure. It is not critical, then, to avoid any metal deposition on the groove sidewalls. It will be appreciated that the overall concepts of the present invention, claimed hereinafter, apply to both forms.

In accordance with the more particular aspects of the present invention, two different methods are provided, summarized next.

Briefly, and in accordance with a more particular aspect of the invention, a first method of fabricating a vertical channel junction gate electric field controlled device of the type including a semiconductor base region of one conductivity type (e.g. N− type) and a gate region of opposite conductivity type (e.g. P+ type), and having a recessed gate structure begins with the step of providing a semiconductor wafer having a base layer of the one conductivity type, and of crystallographic orientation selected to facilitate preferential etching. An upper electrode region layer of the one conductivity type, but of higher conductivity than the base layer, is formed at the upper surface of the base layer. This upper electrode layer is unpatterned, and may be accomplished by means of an N+ diffusion in the entire active area of the device, or it may be epitaxially grown. Next, an oxide layer is formed on the upper surface of the upper electrode region, and is patterned to provide a plurality of parallel elongated windows. The windows define the ultimate locations of gate regions, and the oxide layer portions between the windows define the ultimate locations of upper electrode regions.

Next, using the oxide layer as a mask, the upper electrode region layer and the base layer are preferentially etched to form substantially vertically-walled gate grooves below the windows. By means of epitaxial growth techniques, a partial refill of the grooves with semiconductor material of the opposite conductivity type (e.g. P+ type) is formed to provide a gate structure. At this point, the silicon dioxide layer is removed to expose the upper electrode regions, and metal is evaporated onto the wafer surface to form metallized electrode terminals in ohmic contact with the upper electrode regions and, at the same time, to form elongated gate terminal fingers in ohmic contact with the gate regions at the bottoms of the grooves.

During metal evaporation, a small amount of metal may be deposited on the groove sidewalls, forming an undesirable short between the source and gate regions. Since this sidewall deposition is thinner than the source and gate metallization, it is removed by means of a light or quick etching step.

The resultant device may be described as including a semiconductor base region layer of one conductivity type and of appropriate conductivity for the base region, with a plurality of generally parallel vertically-walled grooves formed in the upper surface of the base region layer. At the upper surface of the base region layer, elongated source region layers extend between the grooves for maximum source area. Elongated junction gate regions of opposite conductivity type are in the bottoms of the grooves. Source terminal metallization is generally on the upper surface layer in ohmic contact with the source region layers, and recessed gate terminal metallization fingers are over and in ohmic contact with the elongated junction gate region in the bottoms of the grooves.

It will be appreciated that this method requires only a single high resolution masking step and achieves self-alignment of the grid and source regions, as well as good contacts to the grid and source. Other important features are that the gate sidewall area is relatively small, reducing parasitic gate/source capacitance; the gate is recessed away from the source, increasing gate/source breakdown voltage; and the lower location of the gate moves the gate pinch off point closer to the drain, thus reducing device transit time for improved frequency response.

In accordance with another aspect of the invention, a fabrication method is provided which eliminates the sidewall coating during metal evaporation. More particularly, in accordance with this second method, a wafer undergoes uniform source layer diffusion, and an oxide layer is formed, both as in the first method. The oxide layer is patterned with a plurality of parallel elongated windows on the upper surface of the upper electrode region. However, alternate windows define the ultimate locations of upper electrode region contacts and gate regions, rather than all mask openings defining the ultimate locations of gate regions as in the first method of the subject invention.

Next, an etchant barrier of silicon nitride is formed over the wafer, patterned so as to cover the windows in the silicon dioxide layer defining the ultimate locations of upper electrode region contacts, and leaving open the windows in the silicon dioxide layer defining the ultimate locations of gate regions.

The wafer is preferentially etched as in the first method to form substantially vertically-walled grooves beneath the gate region windows, but with deliberate undercutting of the oxide layer surrounding the gate region windows. A partial refill of the grooves is formed with semiconductor material of the opposite conductivity type to provide a gate structure, employing epitaxial growth techniques.

At this point, the silicon nitride barrier is removed to expose the windows in the silicon dioxide layer defining the ultimate locations of the upper electrode region contacts, and metal is then evaporated onto the wafer surface to form metallized electrode terminals in ohmic contact with the upper electrode regions, and to form elongated metallized gate terminal fingers in ohmic contact with the gate regions at the bottoms of the grooves.

During the metallization, due to the shadowing created by the overhang in the oxide at the top of the grooves, metallization is not deposited on the groove sidewalls. Thus, the aluminum in the gate and source areas is automatically separated, without the necessity of the quick etch step.

The device resulting from the second method of the invention is quite similar to the device which results from the first method, with the exception that an oxide layer (used to provide shadowing of the sidewalls during metallization) remains over a portion of the surface of the source region, and the source metallization contacts the source regions only through windows in this oxide layer, rather than over the entire upper surface of the source regions as in devices fabricated employing the first method of the invention.

It should be noted that aspects of the present invention have been disclosed in literature published less than one year prior to the filing date hereof. Specifically: B. J. Baliga, "Recessed Gate Junction Field Effect Transistors", International Electron Devices Meeting, Abstract 30.2, pp. 784–786 (December 1980).

BRIEF DESCRIPTION OF THE DRAWINGS

While the novel features of the invention are set forth with particularity in the appended claims, the invention, both as to organization and content, will be better understood and appreciated along with other aspects and features thereof from the following detailed description, taken in conjunction with the drawings, in which:

FIG. 1 is a cross-sectional view of a semiconductor wafer after initial preparation in accordance with the methods of the present invention;

FIG. 2 depicts the wafer after an initial masking and oxide etching step in accordance with a first aspect of the invention;

FIG. 3 depicts the FIG. 2 wafer after preferential etching;

FIG. 4 depicts the FIG. 3 wafer after partial epitaxial refill to form recessed gate regions;

FIG. 5 depicts the wafer after metallization of the source and gate region;

FIG. 8 depicts a wafer after an initial oxide masking and etching step in accordance with a second method of the invention, which follows the steps of FIG. 1, common to both methods;

FIG. 9 depicts a non-critical silicon nitride masking step;

FIG. 10 depicts the wafer of FIG. 9 after preferential etching to form grooves;

FIG. 11 depicts the wafer subsequent to partial epitaxial refill to form the recessed gate region; and FIG. 12 depicts the wafer of FIG. 11 after metallization to form a source, gate, and drain metallization areas.

DESCRIPTION OF THE PREFERRED EMBODIMENTS

Figure 6:
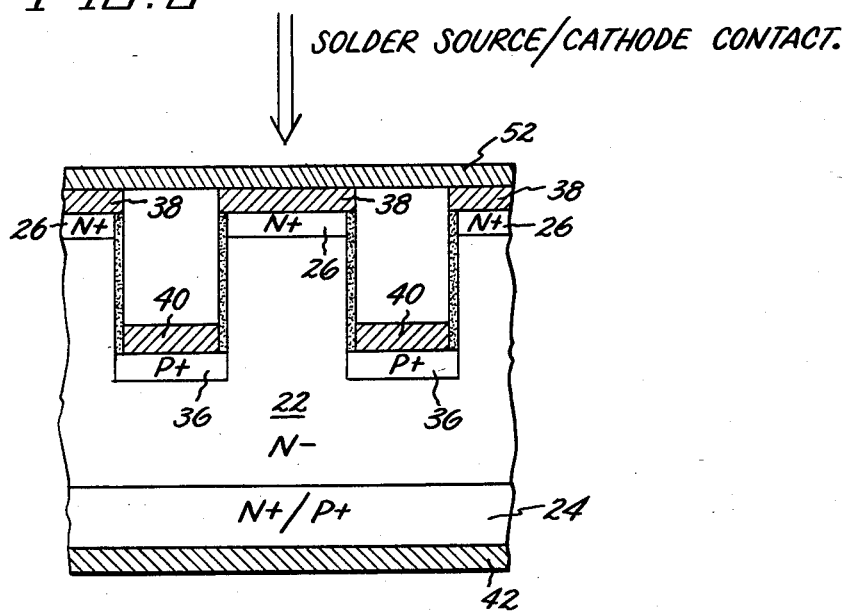
FIG. 6 depicts the application of a single large source contact.

Preliminarily, as noted above, for convenience the field controlled device and fabrication methods of the invention are described herein primarily in the context of a vertical channel FET having N+ source, P+ gate and N+ drain electrodes. However, the invention is equally applicable to other vertical channel electric field controlled devices, such as an FCT having N+ cathode, P+ gate and P+ anode electrodes. Further, all of the active regions may be of conductivity type opposite to that which is specifically disclosed.

Method and Device I

With reference initially to FIGS. 1–7, there is illustrated a first specific method in accordance with the invention for fabricating recessed gate vertical channel electric field controlled devices, and the resultant buried grid structures for such devices.

As a general initial step a semiconductor wafer 20 is provided, having a base layer 22 of one conductivity type and of appropriate conductivity for the base region of the ultimate device, for example, of N− conductivity type. In the preferred embodiment, to facilitate subsequent preferential etching, the base layer 22 is of particular crystallographic orientation selected to facilitate such preferential etching. As one example, the base layer 22 has a <110> surface crystallographic orientation, which provides a set of <111> crystallographic planes lying perpendicular to the <110> surface.

On the lower surface of the wafer 20 is a lower electrode layer 24 which is either of N+ conductivity type in the case of a drain electrode for a field effect transistor (FET), or of P+ conductivity type in the case of an anode electrode for a field controlled thyristor (FCT).

The lower electrode layer 24 may be formed either before, after, or during the steps in accordance with the present invention herein described in detail.

More particularly, a preferred fabrication process in the practice of the present invention begins with the lower layer 24 which accordingly comprises a substrate. A typical example is a 0.01 ohm-cm, antimony-doped silicon substrate of N+ conductivity type having a <110> surface orientation. The base layer 22 is subsequently formed, and comprises a high resistivity, N− type layer epitaxially grown on the substrate 24, the epitaxial growth maintaining the crystallographic orientation of the substrate. As one example, the base layer 22 may be epitaxially grown using dichlorosilane under conditions which provide epitaxial layers with a very low hillock and stacking fault density, as is described in B. J. Baliga, "Control of Hillocks and Stacking Faults During Silicon Vapor Phase Epitaxy", Abs. No. 222, *Electrochem. Soc. Mtg.*, (October 1978). Preferably, the doping profiles of the epitaxial layers are controlled by adjusting the flow of phosphine dopant gas during the growth. A suitable doping level is $2 \times 10^{14}$ per cc with a thickness of fifty microns.

At this point, an upper electrode region layer 26 of the one conductivity type, but of higher conductivity than the base layer 22, is formed at the upper surface 28 of the base layer 22. For example, for a field effect transistor, the layer 26 is an N+ semiconductor type layer, portions of which ultimately become the source region. Preferably, the N+ layer 26 is formed by diffusion, although it may be epitaxially grown. Crystallographic orientation is maintained.

Next, an oxide layer 30 is formed over the N+ layer 26. Conveniently, the oxide layer 30 is thermally grown during the unpatterned diffusion which forms the source area layer 26.

Using conventional photolithographic masking and etching techniques, a plurality of parallel elongated windows 32 are opened in the oxide layer 30. These windows 32 (FIG. 2) define the ultimate locations of gate regions, and the remaining oxide layer 30 portions between the windows 32 define the ultimate locations of source regions. Significantly, a single masking step defines both the ultimate locations of gate regions (below the windows 32) and the ultimate locations of source regions (where oxide 30 remains). Self-alignment thus results.

To facilitate preferential etching, the windows 32 in the oxide layer 30 are crystallographically oriented along the <211> direction of the <110> surface.

With reference to FIG. 3, using known preferential etching techniques, the source electrode layer 26 and the base layer 22 are preferentially etched to form substantially vertically-walled grooves 34 beneath the windows 32, with very little undercutting of the oxide 30. By way of example, an etching mixture of potassium hydroxide and isopropanol in a ratio of approximately 3:1 etches silicon at a rate of approximately five microns per hour when the mixture is maintained at approximately 60° C. This etching technique is also described in the above-identified commonly-assigned Baliga et al application Serial No. 169,853. Other orientation-dependent etches may be employed as, for example, described in an article by D. L. Kendall, "On Etching Very Narrow Grooves in Silicon", *Appl. Phy. Lett.*, Vol. 26, pp. 195–198 (1975).

Next, as shown in FIG. 4, a partial refill 36 of the grooves 34 with semiconductor material of the opposite conductivity type (e.g. P+) is formed to provide a gate structure.

There are two alternative general approaches to forming this partial refill 36: (1) completely refilling the grooves 34 with semiconductor material by means of epitaxial growth, and then again preferentially etching the refilled grooves 34 to remove a predetermined fraction of the semiconductor material; and (2) simply partially epitaxially refilling the grooves 34 in the first place. By way of example, for a P+ type silicon vapor phase epitaxial refill, a mixture of dichlorosilane and hydrogen chloride, in the presence of diborane for P+ type doping, may be employed to obtain planar epitaxial refill in the grooves 34 under conditions which prevent the occurances of voids. At this point, the silicon dioxide layer 30 of FIG. 4 is removed by selective etching, for example employing buffered hydrogen chloride.

Next, as depicted in FIG. 5, the sidewalls of grooves 34 may be passivated, as by conventional anodization techniques which passivate only N type surfaces and not P+ type surfaces. This results in a thin oxide coating 39 on the walls of the groove. Thereafter, aluminum metallization is evaporated onto the wafer surface to form elongated metallized source terminal fingers 38 in ohmic contact with the source regions 26, and to form elongated metallized gate terminal fingers 40 in ohmic contact with the gate regions 36 recessed at the bottom of the grooves 34. As a result, both of these areas 38 and 40 of metallization are formed during the same metallization step, and without the need for any photolithographic metal definition step. Drain (or anode) metallization 42 is also applied at an appropriate time.

During the metallization step to form the electrode structure of FIG. 5, some aluminum may be deposited on the sidewalls of the groove 34. Any metal which is deposited will necessarily be thinner than that of the source and gate metallization fingers 38 and 40, and may thus be selectively removed by means of a quick etch step, leaving the fingers 38 and 40 substantially intact.

Figure 7:
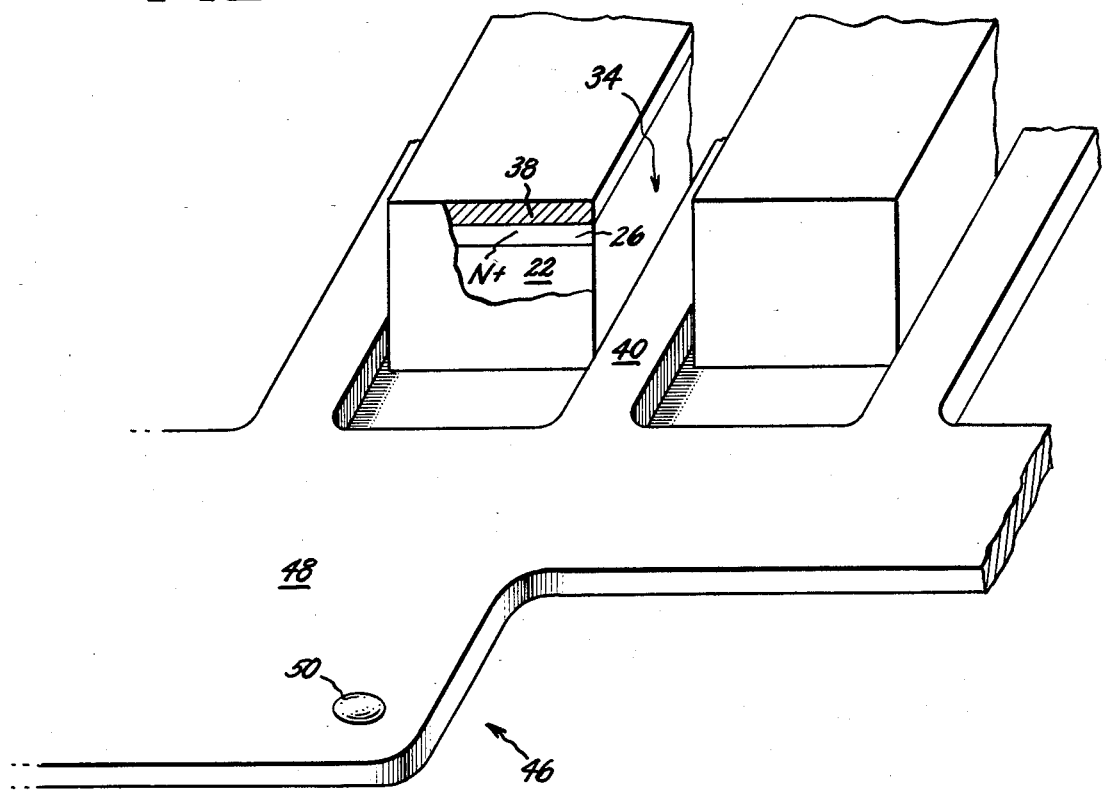
FIG. 7 is an enlarged isometric view showing the manner in which contact to the recessed gate terminal fingers is achieved in a device of FIG. 6.

As may be seen from the isometric view of FIG. 7, at the same time as the preferential etch and partial refill steps of FIGS. 3 and 4, the source and base layers 26 and 22 are etched to form a recessed gate contact pad area 46, adjacent to and at the same level as the bottoms of the partially refilled grooves 34. Then, at the same time as the metal for the gate contact fingers 40 is evaporated, metal to form a gate contact pad area 46 is evaporated. As a result, a gate contact pad 48 is formed as a physical and electrical extension of the gate terminal fingers 40. Also shown in FIG. 7 is a contact point 50 where a gate terminal lead is subsequently connected.

Finally, with reference to FIG. 6, to complete the device structure a large source contact terminal electrode 52 is connected, such as by soldering, to each individual source metallization finger 38. This electrode 52 provides a good low resistance source connection in a convenient manner. It will be appreciated that this type of source connection is made possible by the recessed gate strucure.

In summary, continuous contact metallization is provided over all of the source fingers 26 and all of the gate fingers 36. Further, the width of the source finger 26 metallization 38 is maximized, decreasing the current density in the aluminum used to carry the source current. A low contact resistance to both the source 26 and gate 36 regions therefore results. Significantly, only a single masking step is required to form the entire active device structure.

Method and Device II

As noted above, during the metallization step to form the electrode structure of FIG. 4, some aluminum may be deposited on the sidewalls of the groove 34. Any metal which is deposited will necessarily be thinner than that of the source and gate metallization fingers 38 and 40, and may thus be selectively removed by means of a quick etch step.

This sidewall metallization, however, is a potential problem, which may be eliminated through the second fabrication method of the invention. However, slightly more complex processing is involved. The second method of the invention is described hereinbelow with reference to FIGS. 8-12, which FIGURES, to facilitate comparison, are arranged in the drawings next to generally corresponding drawing FIGURES of the first method. Also, the reference numerals for the second method where elements correspond with those of the first method are derived by adding 100 to the reference numeral of the corresponding element in FIGS. 1-7.

The second method in accordance with the invention begins the same as is depicted in FIG. 1, described above with reference to the first method.

The subsequent step of FIG. 8 is different than that of FIG. 2, however, in that while a plurality of parallel elongated windows are formed in the oxide layer 130, alternate windows define the ultimate locations of upper electrode region contacts and gate regions. Specifically the windows 132 define the ultimate locations of source electrode contacts, and the windows 132' define the ultimate locations of gate regions.

Next, as depicted in FIG. 9, an etchant barrier 133 of silicon nitride is formed, patterned so as to cover the windows 132 in the silicon dioxide layer 130 defining the ultimate locations of source electrode region contacts, and leaving open the windows 132' in the silicon dioxide layer 130 defining the ultimate locations of the gate regions. FIG. 9 deliberately illustrates misalignment which may be tolerated during the masking to form the patterned silicon nitride layer 133. Thus, while the method of FIGS. 8-12 requires an additional masking step compared to the method of FIGS. 1-7, the additional mask need not be critically aligned.

As a specific example, the silicon nitride layer 133 is deposited by the reaction of silane with ammonia employing the techniques described in V. Y. Doo, D. R. Nichols, and G. A. Silvey, "Preparation and Properties of Amorphous Silicon Nitride Films", *J. Electrochem. Soc.*, Vol. 113, pp. 1279-1281 (1966); and T. L. Chu, C. H. Lee and G. A. Gruber, "The Preparation and Properties of Amorphous Silicon Nitride Films", *J. Electrochem. Soc.*, Vol. 114, pp. 717-722 (1967). The silicon nitride layer 133 is in turn covered with a layer of pyrolitic silicon dioxide (not shown) grown by the oxidation of silane, as described in N. Goldsmith and W. Kern, "The Deposition of Vitreous Silicon Dioxide Films from Silane", *RCA Review,* Vol. 28, pp. 153-165 (1967); and B. J. Baliga and S. K. Ghandhi, "Growth of Silica and Phosphosilicate Films", *J. Appl. Phys.,* Vol. 44, pp. 990-994 (1973). This silicon dioxide layer (not shown) is then patterned using conventional photolithography to open windows above the gate region windows 132', and the silicon nitride 133 is removed in those unprotected areas by etching in phosphoric acid at 180° C. (using the pyrolitic silicon dioxide as a mask). The pyrolitic silicon oxide is then removed by selective etching.

Next, as shown in FIG. 10, the upper electrode region layer 126 and the base layer 122 are preferentially etched as before, to form substantially vertically-walled grooves 134 beneath the gate region windows 132' with deliberate undercutting of the oxide layer 130 surrounding the gate region windows 132'.

Next, with reference to FIG. 11, a partial epitaxial refill 136 is formed in the bottoms of the grooves 134, to provide a gate structure.

At this point, the silicon nitride barrier 133 of FIG. 11 is removed by selective etching, and then metal (FIG. 12) is evaporated onto the wafer surface to form metallized source and gate electrode terminal fingers 138 and 140, respectively, in contact with the source regions 126 and the gate regions 136, respectively. As may be seen from FIG. 12, due to the shadowing created by the overhang in the oxide 130 at the top of the groove 134, the aluminum in the gate and source areas is automatically separated, without deposition on the groove sidewalls. Thus a critically aligned photolithographic metal definition step which would normally be required at this stage of device fabrication is avoided.

Following the step of FIG. 12, an upper electrode source contact (not shown) and a drain contact 142 are applied as before.

By way of example, an exemplary finished device has an active area of 800 microns by 800 microns, with 29 gate fingers and 27 interdigitated cathode fingers. Each source finger 26 or 126 has a length of 675 microns, and a width of 5 microns, thus providing the device with a total source area of $9.1 \times 10^{-4}$ cm$^2$.

In these recessed gate devices, it has been found that the gate groove depth plays a critical role in determining the device characteristics. As groove depth is increased, the blocking gain increases, while the saturated output drain current decreases because of an increase in the on resistance as well as an increase in channel pinch-off effect. With a groove depth of 15 microns, devices with blocking gains of about 10 have been fabricated, with on-resistances of 1.5 ohms per cm$^2$. These devices have been found to have a unity power gain cut off frequency of 600 MHz, and a forced gate turn off switching time of less than 25 nanoseconds. Since the half-width of the vertical conduction channel exceeds the zero biased depletion layer width of the gate junction, the devices exhibit pentode-like characteristics wherein the devices operate in the ohmic regime where the drain current increases in proportion to the drain voltage. At the higher gate biased voltages, the high voltage recessed gate devices exhibit triode-like characteristics.

Accordingly, it will be appreciated that by the present invention there are provided techniques for the fabrication of high voltage, vertical channel, junction field effect transistors and field controlled thyristors, and devices so formed. Recessed gate regions are formed which are self-aligned to the source contacts, eliminating several critical photolithographic alignment steps, resulting in improved yield and higher breakdown voltages.

While a specific embodiment of the invention has been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A method of fabricating a vertical channel junction gate electric field device having a recessed gate structure and being of the type including a semiconductor base region of one conductivity type and a gate region of opposite conductivity type, said method comprising:
    providing a semiconductor wafer having a base layer of the one conductivity type;
    forming an electrode layer of one conductivity type atop the base layer;
    forming grooves through said electrode layer and extending into the base layer, such that said grooves divide said upper electrode layer into upper electrode regions between said grooves;
    partially refilling said grooves to thereby form junction gate regions of opposite conductivity type recessed in said grooves; and
    depositing metal onto the wafer surface to form metallized electrode terminals in ohmic contact with the upper electrode region, and metallized recessed gate terminals in ohmic contact with the junction gate regions recessed in the grooves.

2. A method in accordance with claim 1, wherein the grooves are formed with elongated shape, and wherein the gate regions, upper electrode regions, and metallized terminals are all formed with elongated shape.

3. A method in accordance with claim 2, wherein the grooves are formed with substantially vertical sidewalls.

4. A method in accordance with claim 1, which further comprises:
    forming a recessed gate contact pad area adjacent to and at generally the same level as the bottoms of the grooves; and
    depositing metal onto the gate contact pad area to form a gate contact pad as a physical and electrical extension of the gate terminal metallization.

5. A method in accordance with claim 1, which further comprises, prior to the step of depositing metal onto the wafer surface, forming an oxide layer with a slight overhang over the edges of the grooves so as to minimize the deposition of metal on the groove sidewalls.

6. A method in accordance with claim 2, which further comprises, prior to the step of depositing metal onto the wafer surface, forming an oxide layer with a slight overhang over the edges of the grooves so as to minimize the deposition of metal on the groove sidewalls.

7. A method of fabricating a vertical channel junction gate electric field controlled device having a recessed gate structure and being of the type including a semiconductor base region of one conductivity type and a gate region of opposite conductivity type, said method comprising:
    providing a semiconductor wafer having a base layer of the one conductivity type and of crystallographic orientation selected to facilitate preferential etching and the formation of substantially vertical-walled gate grooves;
    forming at the upper surface of the base layer an upper electrode region layer of the one conductivity type but of higher conductivity than the base layer;
    forming a layer of silicon dioxide with a plurality of elongated windows on the upper surface of the upper electrode region, the windows defining the ultimate locations of the gate regions and the oxide layer portions between the windows defining the ultimate locations of upper electrode regions;

preferentially etching the upper electrode region layer and the base layer to form substantially vertically-walled gate grooves below the windows;

partially refilling the grooves with semiconductor material of the opposite conductivity type to provide a gate structure;

removing the silicon dioxide layer to expose the upper electrode regions; and evaporating metal onto the the wafer surface to form metallized electrode terminals in ohmic contact with the upper electrode regions and elongated metallized gate terminal fingers in ohmic contact with the gate regions at the bottoms of the grooves.

8. A method in accordance with claim 7, which comprises the further step of lightly etching the grooves to remove any metal evaporated onto the groove sidewalls.

9. A method in accordance with claim 7, wherein the upper electrode region is formed by diffusion.

10. A method in accordance with claim 7, wherein the step of partially refilling the grooves with semiconductor material of the opposite conductivity type to form a gate structure comprises:

refilling the grooves with semiconductor material of the opposite conductivity type by epitaxial growth; and preferentially etching the refilled grooves to remove a predetermined fraction of the semiconductor material of the opposite conductivity type to define the thickness of the gate structure.

11. A method in accordance with claim 7, wherein the step of partially refilling of the grooves with semiconductor material of the opposite conductivity type to form a gate structure comprises partially refilling the grooves with semiconductor material of the opposite conductivity type by epitaxial growth.

12. A method in accordance with claim 7, which further comprises:

etching the base layer to form a recessed gate contact pad area at the same level as the bottoms of the grooves; and evaporating metal onto the gate contact pad area to form a gate contact pad as a physical and electrical extension of the gate terminal fingers.

13. A method in accordance with claim 7, wherein the base layer provided is of N− conductivity type, the diffused source regions formed are of N+ conductivity type, and the diffused junction gate regions formed are of P+ conductivity type.

14. A method in accordance with claim 7, wherein the base layer comprises silicon with a <110> surface crystallographic orientation and with a set of <111> planes at right angles to the <110> surface, and the elongated windows are defined along the <211> direction.

15. A method of fabricating a vertical channel junction gate electric field controlled device having a recessed gate structure and being of the type including a semiconductor base region of one conductivity type and a gate region of opposite conductivity type, said method comprising:

providing a semiconductor wafer having a base layer of the one conductivity type and of crystallographic orientation selected to facilitate preferential etching and the formation of substantially vertically walled gate grooves;

forming at the upper surface of the base layer an upper electrode region layer of the one conductivity type but of higher conductivity than the base layer;

forming a layer of silicon dioxide with a plurality of parallel elongated windows on the upper surface of the upper electrode region, alternate windows defining the ultimate locations of upper electrode region contacts and gate regions;

forming an etchant barrier of silicon nitride patterned so as to cover the windows in the silicon dioxide layer defining the ultimate locations of upper electrode region contacts and to leave open the windows in the silicon dioxide layer defining the ultimate location of gate regions;

preferentially etching the upper electrode region layer and the base layer to form substantially vertically-walled grooves beneath the gate region windows, with undercutting of the oxide layer surrounding the gate region windows;

partially refilling the grooves with semiconductor material of the opposite conductivity type to provide a gate structure;

removing the silicon nitride barrier to expose the windows in the silicon dioxide layer defining the ultimate locations of the upper electrode region contacts; and evaporating metal onto the wafer surface to form metallized electrode terminals in ohmic contact with the upper electrode regions, and to form elongated metallized gate terminal fingers in ohmic contact with the gate regions at the bottoms of the grooves.

16. A method in accordance with claim 15, wherein the step of partially refilling of the grooves with semiconductor material of the opposite conductivity type to form a gate structure comprises:

refilling the grooves with semiconductor material of the opposite conductivity type by epitaxial growth; and preferentially etching the refilled grooves to remove a predetermined fraction of the semiconductor material of the opposite conductivity type to define the thickness of the gate structure.

17. A method in accordance with claim 15, wherein the step of partially refilling the grooves with semiconductor material of the opposite conductivity type to form a gate structure comprises partially refilling the grooves with semiconductor material of the opposite conductivity type by epitaxial growth.

18. A method in accordance with claim 15, wherein the upper electrode region is formed by diffusion.

19. A method in accordance with claim 15, which further comprises:

etching the base layer to form a recessed gate contact pad area at the same level as the bottoms of the grooves; and evaporating metal onto the gate contact pad area to form a gate contact pad as a physical and electrical extension of the gate terminal fingers.

20. A method in accordance with claim 15, wherein the base layer provided is of N− conductivity type, the diffused source regions formed are of N+ conductivity type, and the diffused junction gate regions formed are of P+ conductivity type.

21. A method in accordance with claim 15, wherein the base layer which is provided is silicon with a <110> surface crystallographic orientation, with a set of <111> planes at right angles to the <110> surface, and the parallel elongated windows are defined along the <211> direction.

* * * * *